United States Patent
Tsai et al.

(10) Patent No.: US 9,214,421 B2
(45) Date of Patent: Dec. 15, 2015

(54) SEMICONDUCTOR DEVICE WITH FINE CONDUCTIVE PILLAR AND METHOD OF MANUFACTURING THE SAME

(71) Applicant: UNITED MICROELECTRONICS CORP., Hsinchu (TW)

(72) Inventors: Chun-Ming Tsai, Hsinchu (TW); Yi-Hsuan Huang, Hsinchu County (TW); Yueh-Ping Chung, Hsinchu County (TW); Ya-Hui Lu, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 157 days.

(21) Appl. No.: 14/040,892

(22) Filed: Sep. 30, 2013

(65) Prior Publication Data

US 2015/0091159 A1   Apr. 2, 2015

(51) Int. Cl.
| | |
|---|---|
| H01L 23/48 | (2006.01) |
| H01L 23/52 | (2006.01) |
| H01L 29/40 | (2006.01) |
| H01L 23/498 | (2006.01) |
| H01L 21/768 | (2006.01) |

(52) U.S. Cl.
CPC .... *H01L 23/49811* (2013.01); *H01L 21/76885* (2013.01); *H01L 2924/0002* (2013.01)

(58) Field of Classification Search
USPC .......... 257/E23.021, E21.508, 737, 777, 257/E21.011, E21.589, E21.509, 758, 774, 257/780; 438/613, 127, 197, 253
See application file for complete search history.

(56) References Cited

U.S. PATENT DOCUMENTS

| | | | | |
|---|---|---|---|---|
| 2003/0164946 A1* | 9/2003 | Borden et al. | ............... | 356/432 |
| 2013/0228918 A1* | 9/2013 | Chen et al. | ..................... | 257/737 |
| 2014/0264734 A1* | 9/2014 | Luo | ....................... | H01L 23/147 |
| | | | | 257/531 |
| 2014/0374875 A1* | 12/2014 | Yen | ........................ | H01L 28/10 |
| | | | | 257/531 |

FOREIGN PATENT DOCUMENTS

WO    2013067854 A1    5/2013

OTHER PUBLICATIONS

Gerber, et al., "Next Generation Fine Pitch Cu Pillar Technology—Enabling Next Generation Silicon Nodes", 2011, pp. 612-618, Electronic Components and Technology Conference.
Makarov, et al., "Deposition of Narrow, High Quality, Closely Spaced, but Isolated Conductors", 2007, pp. 41-45, ASM International.
Amkor Technology, "Fine Pitch Copper Pillar Flip Chip", TS 106A 06'10, Amkor Technology.

* cited by examiner

*Primary Examiner* — Dao H Nguyen
*Assistant Examiner* — Tram H Nguyen
(74) *Attorney, Agent, or Firm* — WPAT, PC; Justin King

(57) ABSTRACT

A semiconductor device and a method of manufacturing the same are provided. A semiconductor device comprises a substrate, a conductive pattern formed on the substrate, and at least a conductive pillar having a predetermined height formed on the conductive pattern. The conductive pillar can be formed under a focus ion beam (FIB) or an electron beam environment. In one embodiment, a diameter of the conductive pillar is no more than 10 μm.

19 Claims, 3 Drawing Sheets

SEMICONDUCTOR DEVICE WITH FINE CONDUCTIVE PILLAR AND METHOD OF MANUFACTURING THE SAME

BACKGROUND

1. Technical Field

The disclosure relates in general to a semiconductor device and a method of manufacturing the same, and more particularly to a semiconductor device with at least one fine conductive pillar and a method of manufacturing the same.

2. Description of the Related Art

Size of semiconductor device applied in the electronic product has been decreased for these years. Reduction of feature size, increase of resolution, improvements of the rate, the efficiency, the density and the cost per integrated circuit unit are the important goals in the semiconductor technology. The electrical properties of the device have to be maintained even improved with the decrease of the size, to meet the products requirements in applications and commercial expectation for consumers. If the layers and/or components of the device are damaged, it would have considerable effects on the electrical properties. For high resolution requirement, it is desirable to find an efficient way for electrical connection (ex: for circuit edit application) and/or feature construction (ex: for product configuration), which cause no damage to the layers and components of the device and is also compatible with the device in reduced size.

SUMMARY

The disclosure is directed to a semiconductor device and a method of manufacturing the same. The semiconductor device has one of more fine conductive pillars. The manufacturing method of the disclosure provides a more efficient and accurate way to establish the electrical connection.

According to the embodiment, a semiconductor device is provided, comprising a substrate, a conductive pattern formed on the substrate, and at least a conductive pillar having a predetermined height formed on the conductive pattern, wherein a diameter of the conductive pillar is no more than 10 µm.

According to the embodiment, a method of manufacturing a semiconductor device is provided, comprising providing a substrate, forming a conductive pattern on the substrate, and forming at least a conductive pillar having a predetermined height on the conductive pattern formed under a focus ion beam (FIB) or an electron beam environment, wherein a diameter of the conductive pillar is no more than 10 µm.

DETAILED DESCRIPTION

Figure 1:
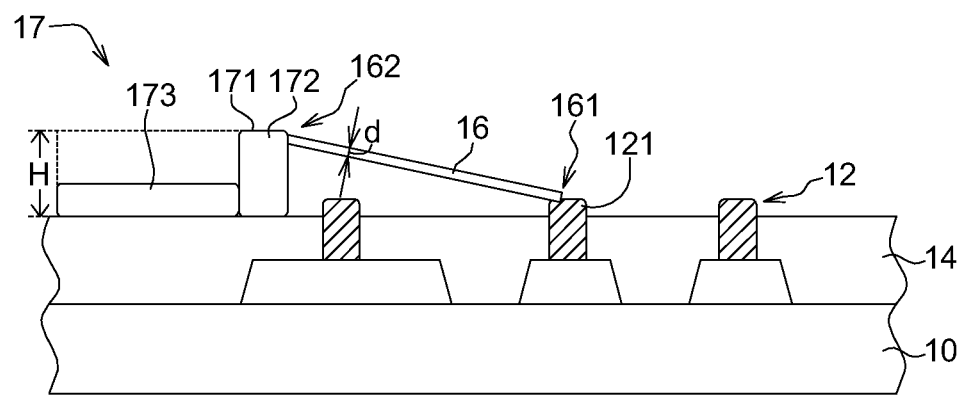
FIG. 1 is a cross-sectional view of a portion of a semiconductor device with one conductive pillar according to one embodiment of the present disclosure.

In the present disclosure, a semiconductor device and a method of manufacturing the same are provided. According to the embodiments, a semiconductor device with at least one conductive pillar is disclosed. Also, the one or more conductive pillar can be fabricated under a focused ion beam (FIB) or an electron beam environment for the purpose of electrical connection. A semiconductor device of the embodiment comprises a conductive pattern formed on a substrate and at least a conductive pillar having a predetermined height formed on the conductive pattern. In one embodiment a diameter of the conductive pillar is no more than 10 µm.

The embodiments of the present disclosure could be implemented in many different applications. For example, the embodiments could be applied for connecting any two nodes/lines on the substrate of the semiconductor device, by crossing over (overhanging) other metals or vias. Also, the embodiments could be applied to a flip chip device by replacing the conductive bumps (ex: Cu pillar bumps) with the fine conductive pillars formed under a focused ion beam (FIB) or an electron beam environment. Other conductive parts, such as the bonding pads of the flip chip device, could be eliminated, and the fine conductive pillars of the embodiment can be directly formed on the positions of the conductive parts (bonding pads) for the purpose of electrical connection. The manufacturing methods of the embodiments would be slightly different, and could be modified and changed according to the procedures in practical applications.

Embodiments are provided hereinafter with reference to the accompanying drawings for describing the related configurations and procedures, but the present disclosure is not limited thereto. The identical and/or similar elements of the embodiments are designated with the same and/or similar reference numerals.

It is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

[First Application—Tilted Conductive Pillar]

In this application, the conductive pillars of the embodiment can be applied for connecting any two nodes/lines on the substrate 10 of the semiconductor device, by crossing over other conductive portions (such as nodes/lines, the first metal layer, the second metal layer, the third metal layer) or vias. It is no need to form an extra insulating film or portion under the conductive pillar to avoid undesired short-circuit conditions.

FIG. 1 is a cross-sectional view of a portion of a semiconductor device with one conductive pillar according to one embodiment of the present disclosure. In FIG. 1, a semiconductor device comprises a substrate 10, a conductive pattern 12 formed on the substrate 10, and at least a conductive pillar 16 having a predetermined height H formed on the conductive pattern 12. Also, the semiconductor device further comprises a dielectric layer 14 on the substrate 10 for insulation. As shown in FIG. 1, the conductive pillar 16 is tilted to the substrate 10 with an angle θ. In one embodiment, the diameter d of the conductive pillar 16 is no more than 10 μm. In another embodiment, the diameter d of the conductive pillar 16 is no more than 5 μm.

According to the embodiment, a focused ion beam (FIB) or an electron beam environment (/system) is applied for forming this fine conductive pillar 16.

Figure 2A:
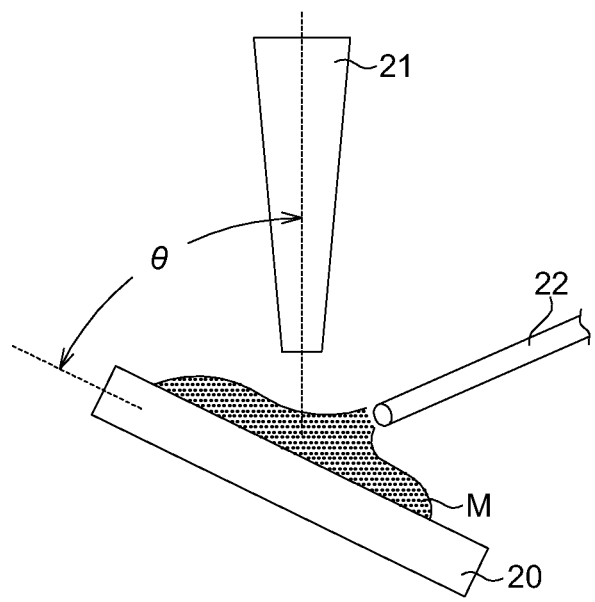
FIG. 2A illustrates a first arrangement showing an energy source and a stage on which the substrate is loaded according to an embodiment of the present disclosure.
Figure 2B:
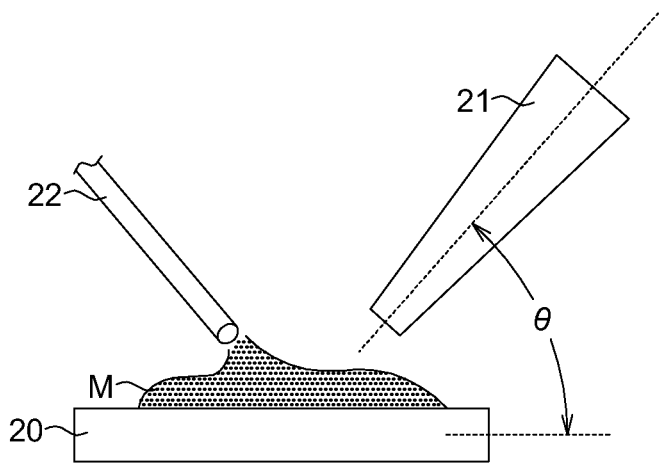
FIG. 2B illustrates a second arrangement showing an energy source and a stage on which the substrate is loaded according to an embodiment of the present disclosure.

FIG. 2A illustrates a first arrangement showing an energy source and a stage on which the substrate is loaded according to an embodiment of the present disclosure. FIG. 2B illustrates a second arrangement showing an energy source and a stage on which the substrate is loaded according to an embodiment of the present disclosure. Please refer to FIG. 1, FIG. 2A and FIG. 2B. As showing in FIG. 2A, the stage 20 of FIG. 2A could be tilted to a vertical energy source 21. It is also an alternative implementation by slanting the energy source 21 to a horizontal stage 20, as showing in FIG. 2B. Both arrangements are capable to growing a tilted conductive pillar 16. Examples of the energy source 21 include a focused ion beam (FIB) and an electron beam. A dual beam system with a FIB and an electron beam is also applicable. In FIG. 2A and FIG. 2B, it is assumed that FIB-assisted deposition occurs when a gas is introduced to the vacuum chamber through an injector 22 and allowed to chemisorb onto the material. By scanning an area with the beam, the precursor gas will be decomposed into volatile and non-volatile components; the non-volatile component M (such as tungsten, platinum, cobalt, gold, etc.,) remains on the surface as a deposition.

Please refer back to FIG. 1. In one embodiment, one end 161 of the tilted conductive pillar 16 is deposited on a first position, such as a node 121, of the conductive pattern 12, and the other end of the conductive pillar 16 is connected to a pad 17. The pad 17 formed on the dielectric layer 14 is higher than the conductive pattern 12, and the other end 162 of the conductive pillar 16 is substantially connected to a top surface 171 of the pad 17.

In one embodiment, the pad 17 can be an entire block as drawn by the dotted line. According to one of fabricating methods, a tilted conductive pillar 16 is firstly formed under the FIB/electron beam environment as depicted in FIG. 2A or FIG. 2B, and the pad 17 is then deposited layer-by-layer under the FIB/electron beam environment until it reaches the predetermined height H that is close to the end 162 of the conductive pillar 16. Finally, the connection between the pad 17 and the end 162 of the conductive pillar 16 is performed. Alternatively, the pad 17 may include a joint portion 172 and a flat portion 173, wherein the joint portion 172 is higher than the flat portion 173 and directly connects the end 162 of the conductive pillar 16 (the fabricating method is similar to that of the former as described above).

In one embodiment, the conductive pillar 16 and the pad 17 (ex: the joint portion 172 and the flat portion 173) can be formed by the same conductive material.

Figure 3:
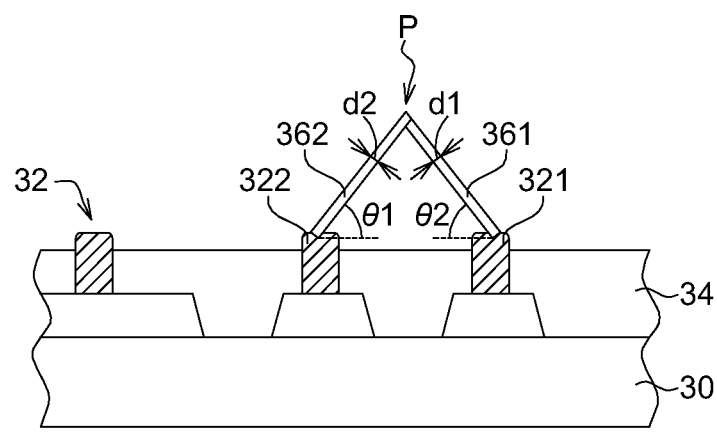
FIG. 3 is a cross-sectional view of a portion of another semiconductor device with two conductive pillars connected to each other according to one embodiment of the present disclosure.

Besides connected to a pad 17 as shown in FIG. 1, the end 162 of the conductive pillar 16 may be connected to another tilted conductive pillar. FIG. 3 is a cross-sectional view of a portion of another semiconductor device with two conductive pillars of one embodiment connected to each other according to one application of the present disclosure.

In FIG. 3, a semiconductor device comprises a substrate 30, a conductive pattern 32 formed on the substrate 30, and two conductive pillars (first conductive pillar 361 and second conductive pillars 362) formed on the conductive pattern 32. One end of the first tilted conductive pillar 361 is deposited on a first position (such as a first conductive node/line 321) of the conductive pattern 32, and the other end of the first tilted conductive pillar 361 is connected to another tilted conductive pillar, such as the second conductive pillars 362. Also, the second conductive pillar 362 is deposited on a second position of the conductive pattern 32 (such as a second conductive node/line 322), and the second position is spaced apart from the first position. Although the first conductive node/line 321 and the second conductive node/line 322 in FIG. 3 are adjacent to each other, it is not necessary to limit the distance between the first and second positions that the first and second conductive pillars 361 and 362 are grown thereon. It is noted that the first conductive pillar 361 and the second conductive pillar 362 can be connected as a bridge to cross over plural nodes, lines and/or vias, depending on the design requirements of the practical applications. It is no need to form the insulator/insulating film between the conductive pillars and the metals to avoid unnecessary short condition.

In one embodiment, the first diameter d1 of the first conductive pillar 361 is no more than 10 μm. In another embodiment, the first diameter d1 is no more than 5 μm. In one embodiment, the second diameter d2 of the second conductive pillar 362 is no more than 10 μm. In another embodiment, the second diameter d2 is no more than 5 μm. The first diameter d1 could be substantially equal to or different from the second diameter d2, which could be varied and determined according to the needs of designs in applications.

Also, the first conductive pillar 361 and the second conductive pillar 362 are slanted and extend upwardly, and a linking point P of the first conductive pillar 321 and the second conductive pillar 322 is distanced from the conductive pattern 32, as shown in FIG. 3. The first conductive pillar 361 is tilted to the substrate 30 with a first angle θ1, and the second conductive pillar 362 is tilted to the substrate 30 with a second angle θ2. The first angle θ1 could be substantially equal to (ex: θ1=θ2) or different from (θ1≠θ2) the second angle θ2.

Other embodiments of the semiconductor devices with different conductive pillar configurations are also applicable, which could be varied depending on the actual needs of the applications. It is, of course, noted that the configurations of FIG. 1 and FIG. 3 are depicted only for demonstration, not for limitation. It is known by people skilled in the art that structures, layouts and steps of method could be modified and adjusted according to the requirements of the practical applications.

Besides the first and second positions that the first and second conductive pillars 361 and 362 are grown thereon positioned at the same horizontal level as shown in FIG. 3, it is also applicable to connect two conductive matters positioned at different horizontal levels by the tilted conductive pillar of the embodiment, which is constructed as a bridge for crossing the elements (ex: metals/vias/layers) positioned between the two conductive matters. For example, one end of the conductive pillar is deposited on a first position (ex: at the first metal layer) of the conductive pattern, and the other end of the conductive pillar is connected a second position (ex: at the second or third metal layer) of the conductive pattern, wherein the first and second positions are at different horizontal levels.

According to the embodiments described above, the conductive pillar 16/361/362 formed under a FIB and/or an electron beam environment is tilted to the substrate 10/30 with an angle θ. One end of the tilted conductive pillar is deposited on a conductive node/line, and the other end of the tilted conductive pillar can be connected to a pad or another tilted conductive pillar, wherein two ends of the conductive pillar can be positioned at different metal layer (ex: the first metal layer vs. the second or third metal layer). Those embodiments can be applied in a circuit repair to cut metal lines or add connection path for changing or correcting the original circuit design. Also, those embodiments can be applied to a semiconductor device for the purpose of the electrical connection.

[Second Application—Fine Conductive Pillar of Flip Chip]

In another one of applications, the present disclosure can be applied to a flip chip device, such as a fine pitch flip chip.

Fine pitch flip chip (FPFC) packaging (i.e., pitch being less than 100 μm) is an emerging technology targeted for various devices including both digital and analog with key drivers, and also including smaller package form factors and lower cost. For example, the fine pitch of the FPFC nowadays is capable of being decreased to about 50 μm in-line and 80 μm ("A" in FIG. 5: row to row pitch)/40 μm ("C" in FIG. 5: trace pitch)/20 μm ("B" in FIG. 5: bond pad width), wherein the bond pads are staggered, and gold (Au) studs or copper (Cu) pillars are used as the bumps on the bond pads.

Figure 4:
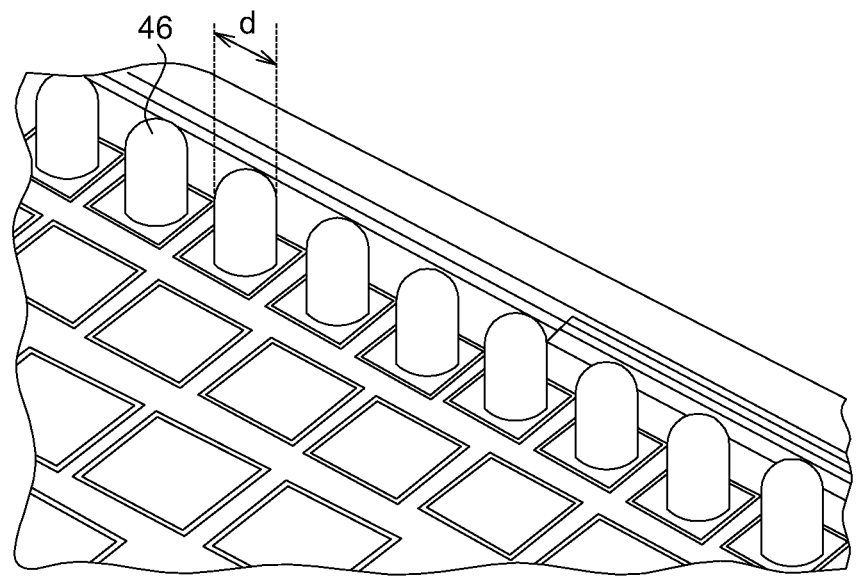
FIG. 4 illustrates a portion of a flip chip with fine conductive pillars according to one embodiment of the present disclosure.

In this application, the Cu pillar bumps of a flip chip device could be replaced by the fine conductive pillars formed under a FIB and/or an electron beam environment according to the present disclosure. FIG. 4 illustrates a portion of a flip chip with fine conductive pillars according to one embodiment of the present disclosure. In one embodiment, the diameter d of each of the fine conductive pillars 46 of FIG. 4 could be down to no more than about 10 μm, or advanced to no more than about 5 μm.

Figure 5:
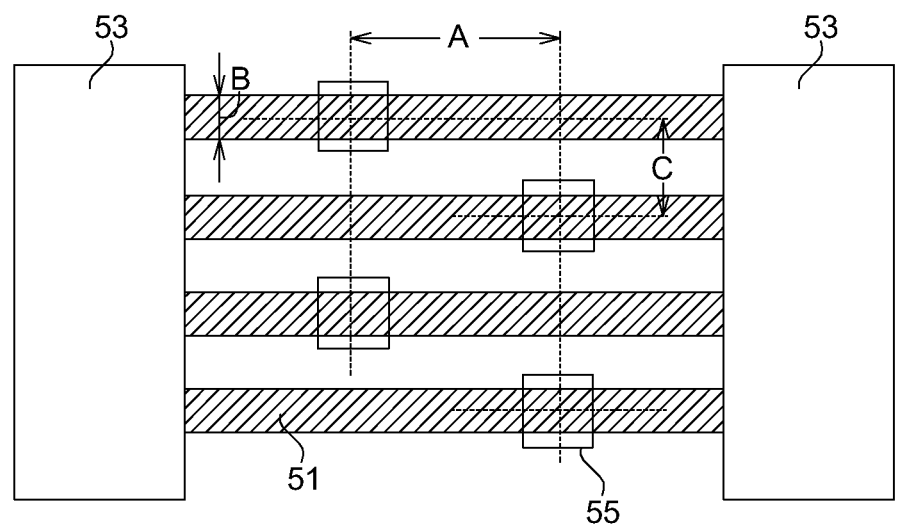
FIG. 5 illustrates a pad design of a flip chip according to one embodiment of the present disclosure.

FIG. 5 illustrates a pad design of a flip chip applied with one embodiment of the present disclosure. Conventionally, there are plural bond pads 51 extending between the solder masks 53, and each bond pad 51 has a die pad opening 55. As shown in FIG. 5, those die pad openings 55 are staggered according to the pad design. In this application, the bond pads 51 of a flip chip device could be replaced by the fine conductive pillars formed under a FIB and/or an electron beam environment according to the present disclosure. Therefore, the bond pads 51 of the conventional flip chip device could be eliminated, and the fine conductive pillars formed by FIB can be directly formed on the positions of bond pads for electrical connection.

In one embodiment, the diameter d of each fine conductive pillar (positioned at the die pad opening 55) of FIG. 5 could be down to no more than about 10 μm, or advanced to no more than about 5 μm. Compared to a general design rule for the FPFC packaging nowadays (ex: 80 μm of "A", 20 μm of "B" and 40 μm of "C" in FIG. 5), this application clearly shows the great improvement and benefits for a FPFC packaging applied with the fine conductive pillars of the embodiment in an aspect of size reduction.

According to the embodiments described above, since the fine conductive pillars of the embodiment can be applied for flip chip bumping (ex: orderly formed on a peripheral region or a central region of the conductive pattern for replacing the conventional bumps), it greatly raises the chance for reducing the size of a flip chip device in the future.

Thus, the fine conductive pillar of the embodiment is applicable by forming on the traces of the conductive pattern of the semiconductor device for achieving the selective and localized electrical connection.

The methods of manufacturing the semiconductor device of the embodiments could be changed and adjusted according to the practical needs of the applications. For example, when the tilted fine conductive pillars are required for electrical connection (as described in the first application), an energy-supplying direction of the focus ion beam or the electron beam is tilted to the conductive pattern/substrate with an angle. When the fine conductive pillars are required for the flip chip, an energy-supplying direction of the focus ion beam or the electron beam is perpendicular to the conductive pattern/substrate. It is noted that step modifications and variations can be made without departing from the spirit of the disclosure for the purpose of meeting the requirements of the practical applications.

According to the aforementioned descriptions, a semiconductor device with at least one fine conductive pillar and a method of manufacturing the same are provided. The conductive pillar can be fabricated by a focused ion beam (FIB) or an electron beam, and can be locally deposited, The configuration of the conductive pillar such as height, tilted angle and diameter can be well-controlled and also variable according to the practical requirements of the applications. The conductive pillar of the embodiment has a fine diameter (ex: less than 10 μm, or even less than 5 μm) which is compatible with the small-sized semiconductor device (with narrow lines and pitches), and also provide a more efficient and accurate way to achieve the electrical connection.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a substrate;
   a conductive pattern formed on the substrate; and
   at least a conductive pillar having a predetermined height formed on the conductive pattern, wherein the conductive pillar is tilted to the conductive pattern, and a diameter of the conductive pillar is no more than 10 μm.

2. The semiconductor device according to claim 1, wherein the conductive pillar is fabricated under a focus ion beam (FIB) or an electron beam environment.

3. The semiconductor device according to claim 1, wherein the conductive pillar is tilted to the substrate.

4. The semiconductor device according to claim 3, wherein one end of the conductive pillar is deposited on a first position of the conductive pattern, and the other end of the conductive pillar is connected to a pad.

5. The semiconductor device according to claim 4, wherein the pad is higher than the conductive pattern, and the other end of the conductive pillar is substantially connected to a top surface of the pad.

6. The semiconductor device according to claim 3, wherein one end of the conductive pillar is deposited on a first position of the conductive pattern, and the other end of the conductive pillar is connected a second position of the conductive pattern, wherein the first and second positions are at different levels.

7. The semiconductor device according to claim 3, wherein one end of the conductive pillar is deposited on a first position of the conductive pattern, and the other end of the conductive pillar is connected to another conductive pillar.

8. The semiconductor device according to claim 7, wherein said another conductive pillar is deposited on a second position of the conductive pattern, and the second position is spaced apart from the first position.

9. The semiconductor device according to claim 7, wherein the conductive pillar and said another conductive pillar are slanted and extend upwardly, and a linking point of the conductive pillar and said another conductive pillar is distanced from the conductive pattern.

10. The semiconductor device according to claim 7, wherein the conductive pillar is tilted to the substrate with a first angle 61, and said another conductive pillar is tilted to the substrate with a second angle 62.

11. The semiconductor device according to claim 1, comprising several said conductive pillars, wherein the conductive pillars are spaced apart from each other.

12. The semiconductor device according to claim 11, comprising several said conductive pillars orderly formed on a central region of the conductive pattern.

13. The semiconductor device according to claim 11, wherein the conductive pattern comprising a plurality of traces, and several said conductive pillars are formed on the traces respectively.

14. The semiconductor device according to claim 11, wherein the semiconductor device is a flip chip device.

15. The semiconductor device according to claim 11, wherein the conductive pillar is fabricated under a focus ion beam (FIB) or electron beam environment.

16. A method for manufacturing a semiconductor device, comprising:
  providing a substrate;
  forming a conductive pattern on the substrate; and
  forming at least a conductive pillar having a predetermined height on the conductive pattern, and the conductive pillar being formed under a focus ion beam (FIB) or an electron beam environment for assisting material deposition of the conductive pillar, wherein a diameter of the conductive pillar is no more than 10 μm.

17. The method according to claim 16, wherein an energy-supplying direction of the focus ion beam or the electron beam is tilted to the conductive pattern with an angle.

18. The method according to claim 16, wherein an energy-supplying direction of the focus ion beam or the electron beam is perpendicular to the conductive pattern.

19. A flip chip device, comprising:
  a substrate;
  a conductive pattern formed on the substrate, and the conductive pattern comprising a plurality of traces apart from each other; and
  a plurality of conductive pillars, each of said plurality of conductive pillars is respectively formed on one of the plurality of traces of the conductive pattern, and each of the conductive pillars having a predetermined height formed on the respective trace of the conductive pattern, and directly contacting the respective trace of the conductive pattern, wherein each of the conductive pillars has a diameter of no more than 10 μm, and the conductive pillars are staggered from each other.

* * * * *